US009354003B2

(12) United States Patent
Lin

(10) Patent No.: US 9,354,003 B2
(45) Date of Patent: May 31, 2016

(54) HEAT SINK FASTENING DEVICE AND THERMAL MODULE ASSEMBLY USING SAME

(71) Applicant: ASIA VITAL COMPONENTS CO., LTD., New Taipei (TW)

(72) Inventor: Sheng-Huang Lin, New Taipei (TW)

(73) Assignee: ASIA VITAL COMPONENTS CO., LTD., New Taipei (TW)

( * ) Notice: Subject to any disclaimer, the term of this patent is extended or adjusted under 35 U.S.C. 154(b) by 259 days.

(21) Appl. No.: 14/250,371

(22) Filed: Apr. 10, 2014

(65) Prior Publication Data

US 2015/0296663 A1    Oct. 15, 2015

(51) Int. Cl.
*H01L 23/34* (2006.01)
*F28D 15/02* (2006.01)
*F28F 99/00* (2006.01)
*H01L 23/40* (2006.01)

(52) U.S. Cl.
CPC ............ *F28F 99/00* (2013.01); *F28D 15/0275* (2013.01); *H01L 23/34* (2013.01); *F28F 2275/08* (2013.01)

(58) Field of Classification Search
CPC ..... H01L 23/40; H01L 23/32; H01L 23/4093; H01L 23/34; H01L 2023/4075; H01L 2023/4083; H05K 7/20418; F28F 2275/08; F28F 9/00; Y10T 24/42; Y10T 24/44026; Y10T 24/44043; F28D 15/0275
USPC ................................................. 165/80.3, 185
See application file for complete search history.

(56) References Cited

U.S. PATENT DOCUMENTS

| | | | | |
|---|---|---|---|---|
| 6,098,938 A * | 8/2000 | Tsai | ......................... | G06F 1/183 248/200 |
| 6,795,317 B1 * | 9/2004 | Liu | ...................... | H01L 23/4093 165/80.3 |
| 7,099,156 B2 * | 8/2006 | Chen | .................... | H01L 23/4093 165/80.3 |
| 7,430,122 B2 * | 9/2008 | Li | ........................ | H01L 23/4093 165/104.33 |
| 7,480,144 B2 * | 1/2009 | Li | ........................ | H01L 23/4093 165/104.33 |
| 7,675,753 B2 * | 3/2010 | Li | ........................... | G06F 1/183 165/185 |
| 7,808,790 B2 * | 10/2010 | Lin | ...................... | H01L 23/4093 165/80.3 |
| 2005/0201064 A1 * | 9/2005 | Chen | .................... | H01L 23/4093 361/719 |

* cited by examiner

*Primary Examiner* — Tho V Duong

(57) ABSTRACT

A heat sink fastening device includes an operating member and a retaining member axially extended through the operating member and associated with the latter via a pivot shaft. The operating member includes a cylindrical cam portion, which has an elastic element received therein to provide the cam portion with an elastic force. The cam portion has an upper end formed into a pair of cam surfaces, on which the pivot shaft is rested. The operating member can be horizontally rotated about an axis thereof. When the operating member is rotated, the cam surfaces rotate and cause the pivot shaft to move from a higher to a lower position on the cam surfaces or vice versa, so that the retaining member associated with the operating member via the pivot shaft is brought by the pivot shaft to axially move downward to a released position or upward to a fastened position.

12 Claims, 12 Drawing Sheets

HEAT SINK FASTENING DEVICE AND THERMAL MODULE ASSEMBLY USING SAME

FIELD OF THE INVENTION

The present invention relates to a heat sink fastening device, and more particularly to a heat sink fastening device for fixedly attaching a heat sink onto a heat-producing electronic element. The present invention also relates to a thermal module assembly that uses the above-mentioned heat sink fastening device.

BACKGROUND OF THE INVENTION

The rapidly developed electronic industry enables electronic elements to have constantly increased operating speed. The electronic elements operating at high speed also produce a large quantity of heat, which causes rising temperature and accordingly unstable performance of the electronic elements and the system using same. Normally, to ensure normal and stable operation of a heat-producing electronic element, a heat-dissipation device is mounted on the electronic element to remove the produced heat from the electronic element.

Currently, to solve the heat dissipation problem thereof, every heat-producing electronic element has a heat sink mounted thereon. The heat sink includes a base, which is in tight contact with the electronic element, and a plurality of radiation fins mounted on the base. The heat sink can be attached onto the electronic element in many different ways. For the heat sink to tightly attach to the surface of the heat-producing electronic element, a fastening device is usually used to help in the firm contact of the heat sink with the electronic element. Generally, the fastening device for this purpose includes a mount, which is connected to a circuit board, and a retaining member, which is associated with the heat sink and can be fastened to the mount to thereby force the heat sink against the surface of the heat-producing electronic element, which is mounted on the circuit board.

A prior heat sink fastening device includes a first retaining member, a second retaining member and a handle. The first retaining member includes an elastic arm that can be downward pushed. The elastic arm has an end bent into a first retaining portion and another end providing a bearing surface. The second retaining member is located on one end of the first retaining member that provides the bearing surface. The handle is connected to the second retaining member and is provided at an end with an eccentric wheel for pressing against the bearing surface. The eccentric wheel has a protruded point formed near a free end thereof. When the eccentric wheel rotates, the protruded point is shifted from one side to another opposite side of the second retaining member to catch against an edge of the second retaining member. Further, a length of the edge of the eccentric wheel that is in contact with the bearing surface when the eccentric wheel rotates is formed with a flange.

However, with the coming of the digital information age, miniaturized electronic products have become the main stream in the electronic industry development. The conventional heat sink fastening device with the above structure apparently could not be easily operated within a limited or narrow space in the miniaturized electronic product to fasten the heat sink to the heat-producing electronic element.

Therefore, it is tried by the inventor to overcome the above problem by developing an improved heat sink fastening device that can be easily operated in a limited space to tightly attach a heat sink to a heat-producing electronic element.

SUMMARY OF THE INVENTION

A primary object of the present invention is to provide a thermal module assembly that includes at least one heat sink fastening device, with which the thermal module assembly can be quickly mounted onto or removed from a heat-producing electronic element without the need of using any hand tool or screws.

Another object of the present invention is to provide a heat sink fastening device that includes an operating member and a retaining member. When the operating member is horizontally rotated about an axis thereof, the retaining member is caused to move upward to a fastened position or to move downward to a released position.

To achieve the above and other objects, the heat sink fastening device according to the present invention includes an operating member, a mounting ring, a retaining member, an elastic element and a pivot shaft. The operating member includes a cylindrical cam portion and a switch portion radially outward extended from an outer surface of the cam portion. The cam portion has an upper end and a lower end, and the upper end is formed into a pair of cam surfaces. Each of the cam surfaces has two opposite ends respectively formed with a high-point notch and a low-point notch, and the cam surfaces are respectively extended from the low-point notch to the high-point notch in an upward slope. The mounting ring is mounted in the cam portion and internally defining an axial bore. The retaining member is axially extended through the cam portion and has an upper end and a lower end, the upper end is upward extended through the axial bore of the mounting ring to the upper end of the cam portion and is provided with at least one pivot hole, and the lower end is downward extended to form a retaining portion, which is provided with at least one engaging hole. The elastic element is received in the cam portion and located below the mounting ring to fit on around the lower end of the retaining member. The pivot shaft is located on the upper end of the cam portion and rotatably received in the at least one pivot hole formed at the upper end of the retaining member. The pivot shaft has a first end portion and a second end portion separately rested on the pair of cam surfaces. The switch portion of the operating member can be horizontally shifted from one position to another position to rotate the cam portion about an axis thereof, so that the cam surfaces are brought to rotate at the same time, causing the first end portion and the second end portion of the pivot shaft to move along the cam surfaces from the high-point notches to the low-point notches or vice versa, which in turn brings the retaining member to move downward or upward in the direction of the axis of the cam portion.

To achieve the above and other objects, the thermal module assembly according to the present invention includes a mount, a heat sink and a heat sink fastening device. The mount is provided on two opposite outer sides with a protrusion each. The heat sink is mounted on the mount and includes a base associated with the mount and a radiation fin assembly held on the base. The base is provided on two opposite lateral sides with two outward extended flat portions, each of which is provided on a top with a recess, and the recess has a through hole formed on a bottom thereof to extend through the flat extended portion. The heat sink fastening device is located on at least one side of the heat sink and includes an operating member, a mounting ring, a retaining member, an elastic element and a pivot shaft. The operating member is located above one of the flat extended portions and includes a cylindrical cam portion and a switch portion radially outward extended from an outer surface of the cam portion. The cam portion has an upper end and a lower end, and the upper end is formed into a pair of cam surfaces. Each of the cam surfaces has two opposite ends respectively formed with a high-point notch and a low-point notch; and the cam surfaces are respectively extended from the low-point notch to the high-point notch in an upward slope. The lower end of the cam portion is aligned with the recess on the flat extended portion. The mounting ring is mounted in the cam portion and internally defines an axial bore. The retaining member is axially extended through the cam portion and has an upper end and a lower end; the upper end is upward extended through the through hole on the flat extended portion and the axial bore of the mounting ring to the upper end of the cam portion and is provided with at least one pivot hole; and the lower end is downward extended to form a retaining portion, which is provided with at least one engaging hole for engaging with one of the protrusions formed on the mount. The elastic element is received in the cam portion and located between the mounting ring and the recess of the flat extended portion to fit on around the lower end of the retaining member. The pivot shaft is located on the upper end of the cam portion and rotatably received in the at least one pivot hole formed at the upper end of the retaining member. The pivot shaft has a first end portion and a second end portion separately rested on the pair of cam surfaces. The switch portion of the operating member can be horizontally shifted from one position to another position to rotate the cam portion about an axis thereof, so that the cam surfaces are brought to rotate at the same time, causing the first end portion and the second end portion of the pivot shaft to move along the cam surfaces from the high-point notches to the low-point notches or vice versa, which in turn brings the retaining member to move downward or upward in the direction of the axis of the cam portion.

The mount is connected to a circuit board, on which at least one heat-producing electronic element is mounted. The mount includes two mount bodies that are symmetrically located at two opposite lateral sides of the electronic element, and the protrusions are provided on two opposite outer sides of the two mount bodies.

The radiation fin assembly has two retreated portions formed on two opposite lateral sides thereof, and the base has two stoppers provided on a top surface at positions corresponding to the two retreated portions on the radiation fin assembly.

The cam portion internally defines an upper receiving space for receiving the mounting ring therein, and a lower receiving space located below the upper receiving space for receiving the elastic element therein. The upper receiving space is communicable with the lower receiving space; and a radially inward protruded rib portion is formed in the cam portion to locate between the upper and the lower receiving space.

The pivot shaft includes a middle section, which is located between the first end portion and the second end portion and has a stop ring fitted therearound.

The cam surfaces respectively have a length being an ascending bearing surface located adjacent to the high-point notch and another length being a descending bearing surface located adjacent to the low-point notch.

The retaining member includes two facing arm portions extended from the lower end to the upper end of the retaining member, and the pivot hole is formed on each of the arm portions at the upper end.

With the above arrangements, the heat sink fastening device of the present invention can be easily and effortlessly operated in a limited space to a fastened position for tightly attaching the heat sink of the thermal module assembly to the heat-producing electronic element, or to a released position to release the heat sink from the electronic element.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
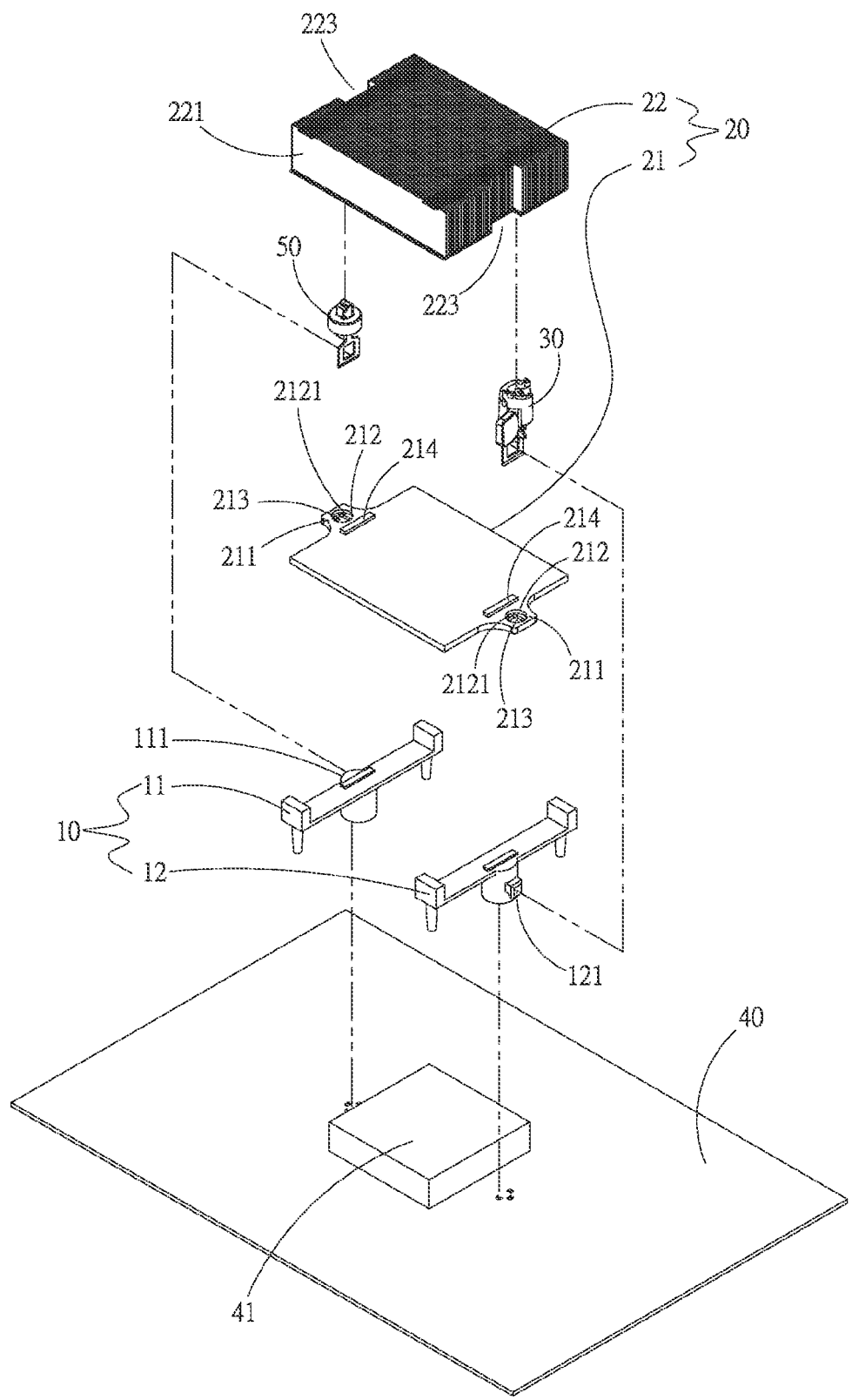
FIG. 1 is an exploded perspective view of a thermal module assembly according to a preferred embodiment of the present invention.

The present invention will now be described with some preferred embodiments thereof and with reference to the accompanying drawings. For the purpose of easy to understand, elements that are the same in the preferred embodiments are denoted by the same reference numerals.

Figure 2:
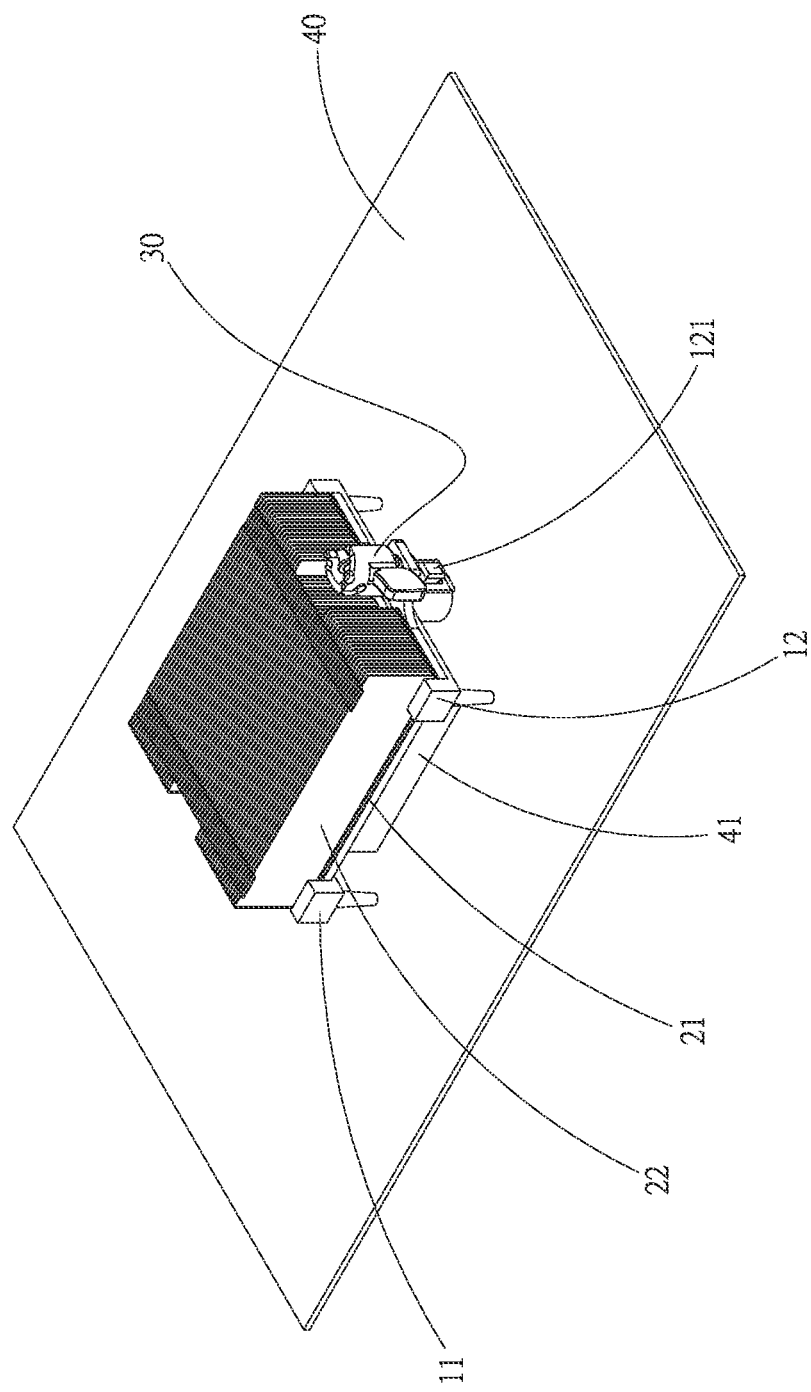
FIG. 2 is an assembled view of FIG. 1.

Please refer to FIGS. 1 and 2 that are exploded and assembled perspective views, respectively, of a thermal module assembly according to a preferred embodiment of the present invention. As shown, the thermal module assembly includes a mount 10, a heat sink 20, and a first heat sink fastening device 30. The mount 10 is connected onto a circuit board 40; the heat sink 20 is attached to a top surface of a heat-producing electronic element 41 mounted on the circuit board 40; and the first heat sink fastening device 30 is located on at least one side of the heat sink 20. A second heat sink fastening device 50 is located on another side of the heat sink 20 opposite to the first heat sink fastening device 30. By fastening the first heat sink fastening device 30 and the second heat sink fastening device 50 to the mount 10, the heat sink 20 can be tightly attached to the top surface of the heat-producing electronic element 41, so that heat produced by the electronic element 41 can be dissipated into ambient air via the heat sink 20.

The mount 10 includes two mount bodies 11, 12 that are symmetrically located at two opposite lateral sides of the electronic element 41 and are fixedly connected to the circuit board 40 by means of screws or other connection means, such as snap fitting. The two mount bodies 11, 12 are provided on respective lateral outer side with a protrusion 111, 121, to which the second and the first heat sink fastening device 50, 30 are fastened, respectively.

The heat sink 20 is mounted on the mount 10, and includes a base 21 and a radiation fin assembly 22. The base 21 is associated with the mount 10 with an underside of the base 21 fitly attached to the top surface of the electronic element 41 for absorbing the heat produced by the electronic element 41. The base 21 is provided at two opposite lateral sides with two outward extended flat portions 211. Each of the two flat extended portions 211 is provided with a recess 212, a bottom 2121 of which is provided with a through hole 213 that extends through the flat extended portion 211. Two stoppers 214 are provided on a top surface of the base 21 to locate opposite to each other. In an operable embodiment of the present invention, the radiation fin assembly 22 includes a plurality of radiation fins 221. The radiation fins 221 of the radiation fin assembly 22 are erected on the top surface of the base 21 and are fixedly connected thereto by means of welding or the like, such that the radiation fins 221 are parallel to one another and an air passage is formed between any two adjacent ones of the radiation fins 221 for air to flow therethrough. Two retreated portions 223 are formed on two opposite lateral sides of the radiation fin assembly 22 at positions corresponding to the two stoppers 214. With the stoppers 214 and the retreated portions 223, the radiation fin assembly 22 can be stably located on the base 21 with the radiation fins 221 evenly distributed over the top surface of the base 21. In another operable embodiment of the present invention, the radiation fin assembly 22 further includes a plurality of heat pipes (not shown) extended through the radiation fins 221.

Figure 3A:
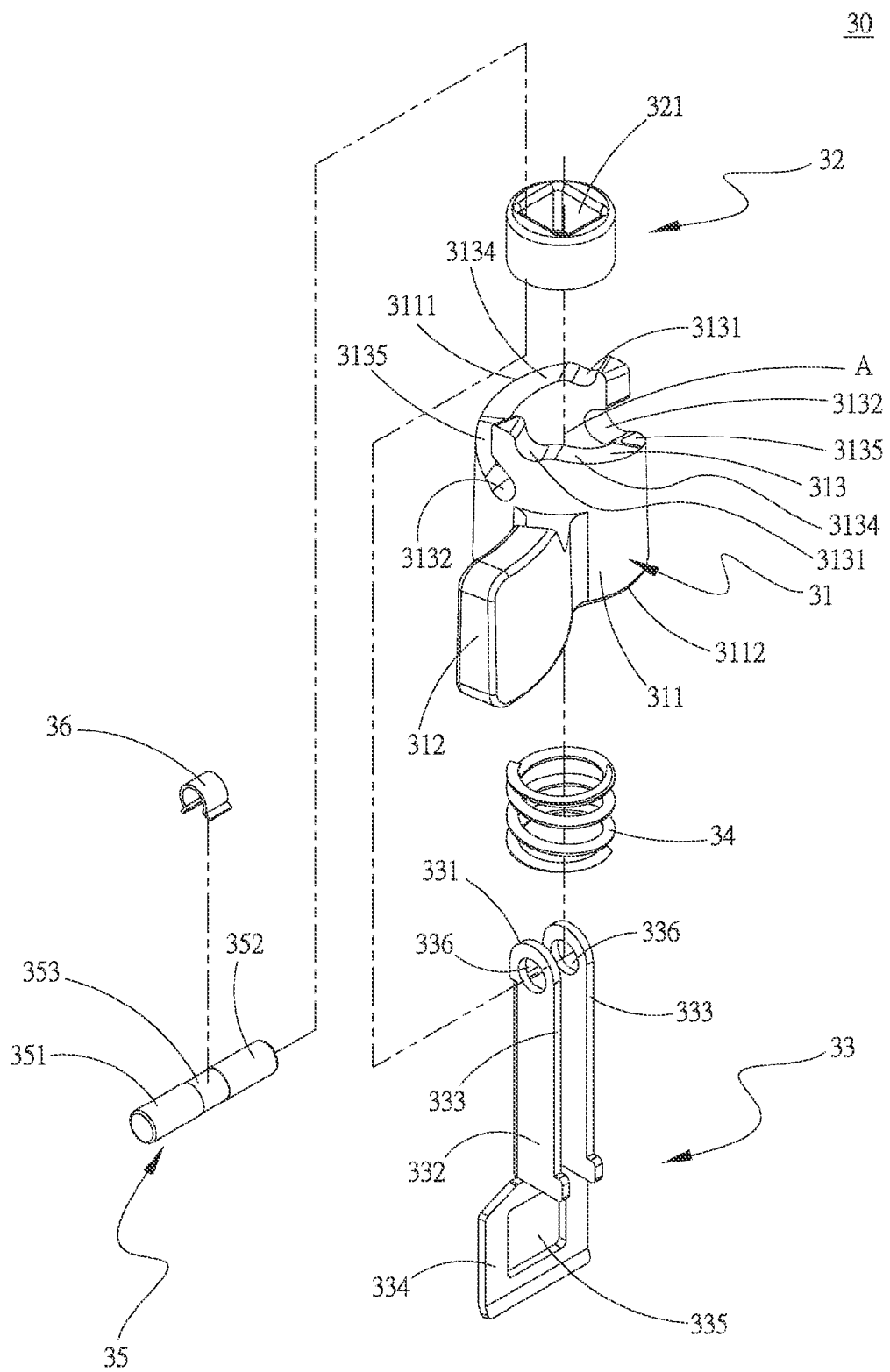
FIG. 3A is a fully exploded perspective view of a first heat sink fastening device according to the present invention.
Figure 3B:
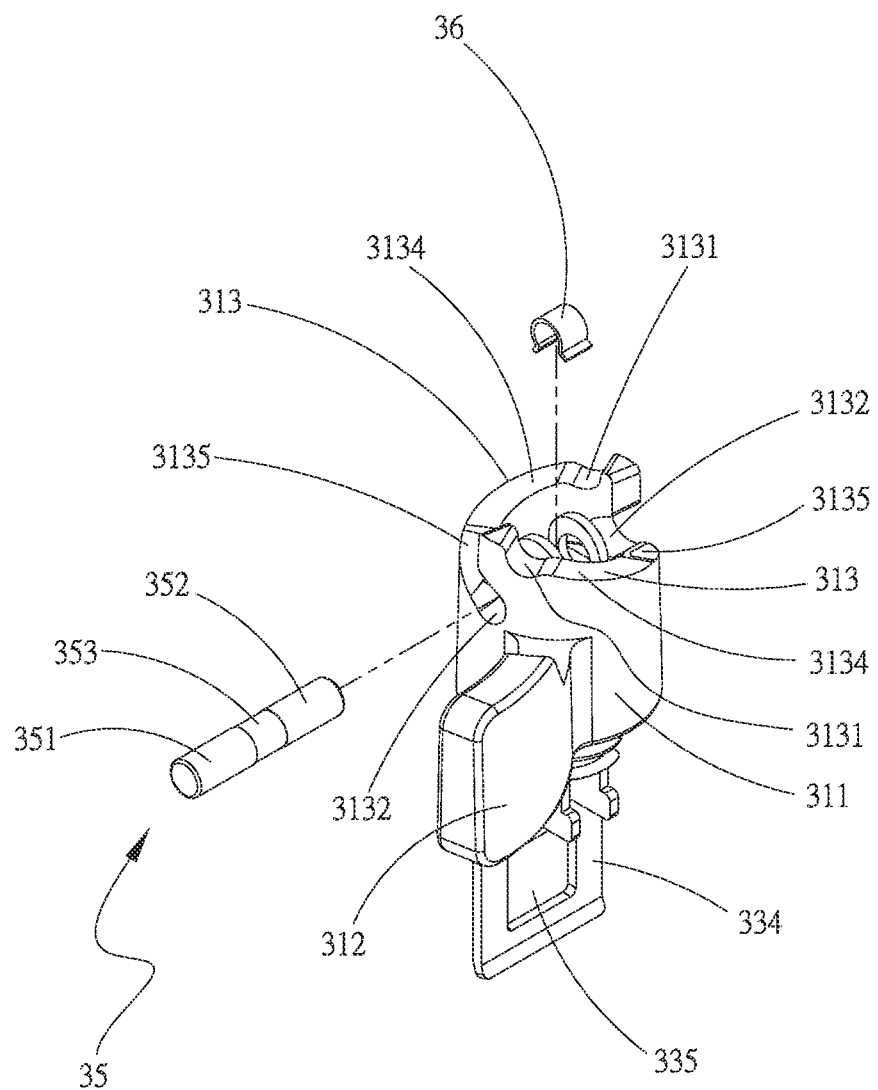
FIG. 3B is a partially assembled view of FIG. 3A.
Figure 3C:
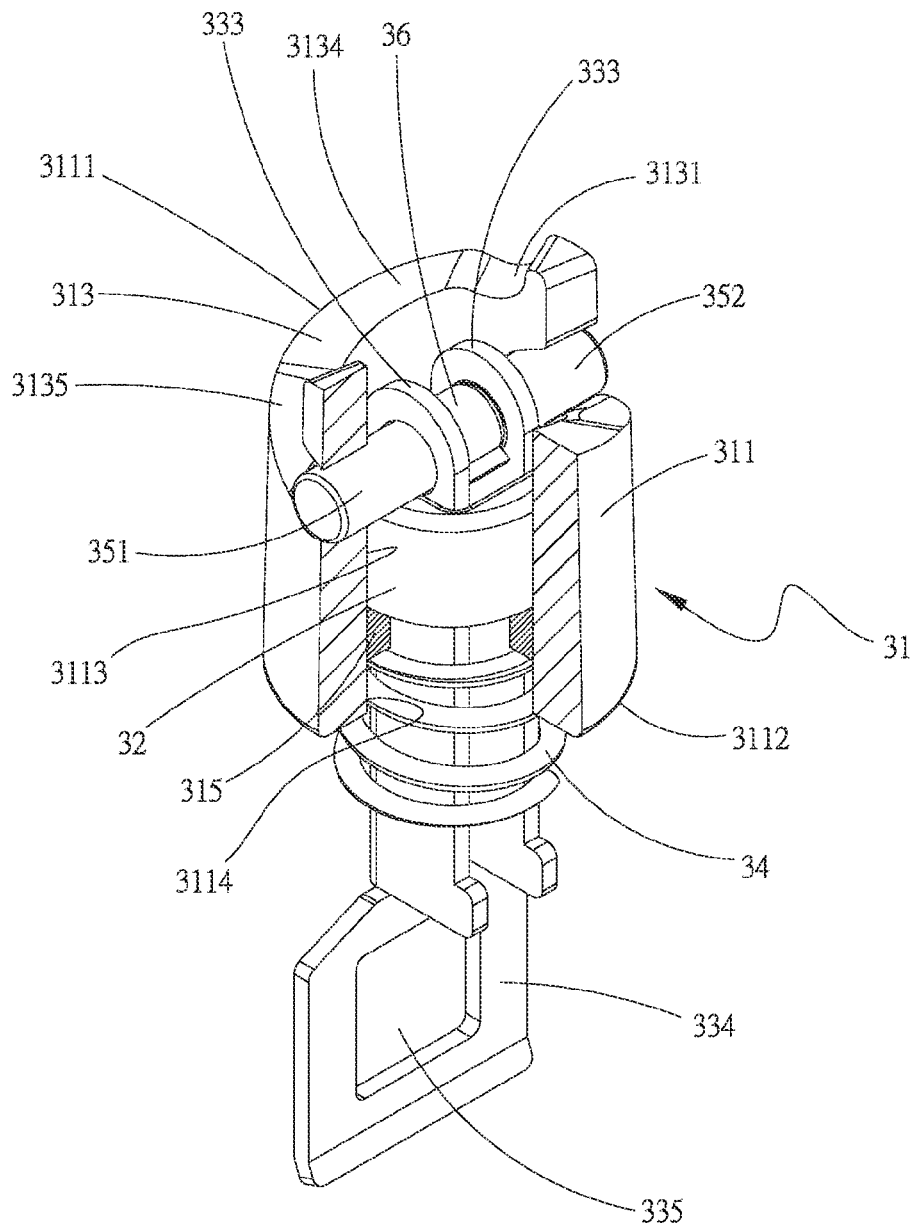
FIG. 3C is a cutaway view of the first heat sink fastening device of FIG. 3A.

Please refer to FIGS. 3A, 3B and 3C at the same time. The first heat sink fastening device 30 includes an operating member 31, a mounting ring 32, a retaining member 33, an elastic element 34, and a pivot shaft 35 for pivotally connecting the operating member 31 and the retaining member 33 to each other. The operating member 31 has a cylindrical cam portion 311 and a switch portion 312 radially outward extended from an outer surface of the cam portion 311. The cam portion 311 has an upper end 3111 and a lower end 3112, and an axis A. The upper end 3111 and the lower end 3112 are located at two opposite ends of the cam portion 311, and the axis A is defined at a center of the cam portion 311. The cam portion 311 has an inner hollow space for receiving the retaining member 33 therein. More specifically, the cam portion 311 internally defines an upper receiving space 3113 for receiving the mounting ring 32 therein, and a lower receiving space 3114 located below the upper receiving space 3113 for receiving the elastic element 34 therein. The upper receiving space 3113 is communicable with the lower receiving space 3114. A radially inward protruded annular rib portion 315 is formed in the cam portion 311 to locate between the upper and the lower receiving space 3113, 3114. The upper end 3111 of the cam portion 311 is formed into a pair of cam surfaces 313, each of which has two opposite ends respectively formed with a high-point notch 3131 and a low-point notch 3132. Each of the cam surfaces 313 is extended from the low-point notch 3132 to the high-point notch 3131 in an upward slope. A length of the cam surface 313 adjacent to the high-point notch 3131 is an ascending bearing surface 3134, while another length of the cam surface 313 adjacent to the low-point notch 3132 is a descending bearing surface 3135.

The retaining member 33 is upward extended through the cam portion 311 in a direction of the axis A, and includes two facing arm portions 333 extended from an upper end 331 to a lower end 332 of the retaining member 33. The two arm portions 333 are respectively provided at the upper end 331 with a through hole for serving as a pivot hole 336. A retaining portion 334 is downward extended from the lower end 332 of the retaining member 33. The retaining portion 334 has at least one engaging hole 335 formed thereon for engaging with the protrusion 121 formed on the mount body 12. The retaining member 33 is integrally formed by punching and stamping a metal sheet. The retaining member 33 is not necessarily limited to the shape shown in FIGS. 3A to 3C, but can be other suitable shapes, such as an inverted T-shape. The retaining portion 334 can have multiple engaging holes provided thereon; and the mount body 12 of the mount 10 can have multiple protrusions 121 provided thereon corresponding to the engaging holes on the retaining portion 334.

The mounting ring 32 internally defines an axial bore 321 and is fitted on around the retaining member 33. The mounting ring 32 holds the retaining member 33 in place in the cam portion 311 of the operating member 31. Since the mounting ring 32 is located between the retaining member 33 and the operating member 31, the operating member 31 being rotated by a user would not radially interfere with the retaining member 33.

The elastic element 34 is located below the rib portion 315 and the mounting ring 32, and is a compression spring fitted on around the lower end 332 of the retaining member 33 to provide the operating member 31 with an elastic force.

The pivot shaft 35 is located on the upper end 3111 of the cam portion 311 and is rotatably received in the pivot holes 336 formed at the upper end 331 of the retaining member 33. The pivot shaft 35 has a first end portion 351, a second end portion 352, and a middle section 353 located between the first and the second end portion 351, 352. The first end portion 351 and the second end portion 352 are separately rested on the two cam surfaces 313 of the cam portion 311 with the middle section 353 located between the two facing arm portions 333 of the retaining member 33. A stop ring 36 is fitted on around the middle section 353, such that the pivot shaft 35 is prevented from being sidewardly movable in the pivot holes 336 to ensure that the first end portion 351 and the second end portion 352 located at two lateral outer sides of the arm portions 333 are always equal in length. In the event the two end portions 351, 352 of the pivot shaft 35 located at two lateral outer sides of the arm portions 333 are not equal in length, the shorter one of the two end portions would not have a sufficient length for stably resting on the cam surface 313, and the two cam surfaces 313 could not apply uniform forces on the first and the second end portions 351, 352. By fitting the stop ring 36 around the middle section 353 of the pivot shaft 35, it is able to eliminate the above problem.

Figure 4A:
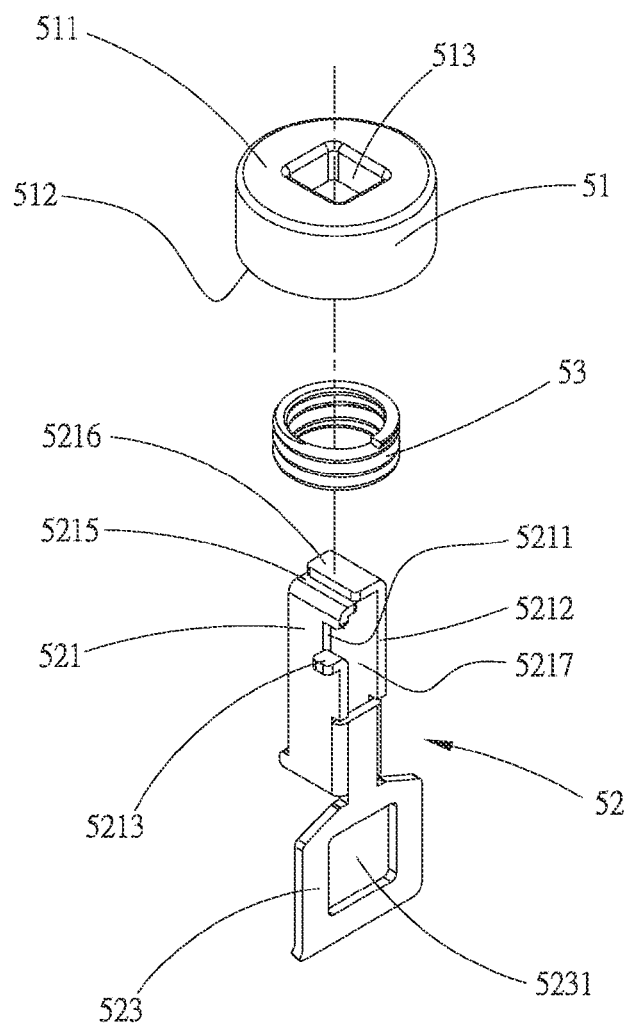
FIG. 4A is a fully exploded perspective view of a second heat sink fastening device according to the present invention.
Figure 4B:
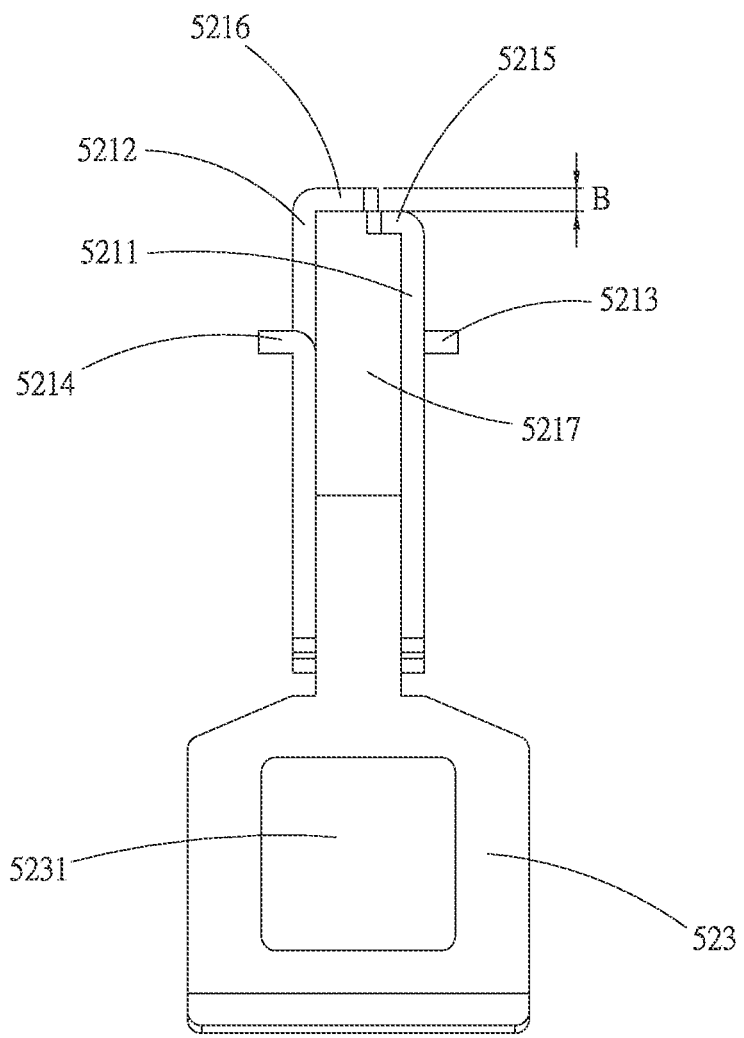
FIG. 4B is an elevational view of a retaining member for the second heat sink fastening device of FIG. 4A.
Figure 4C:
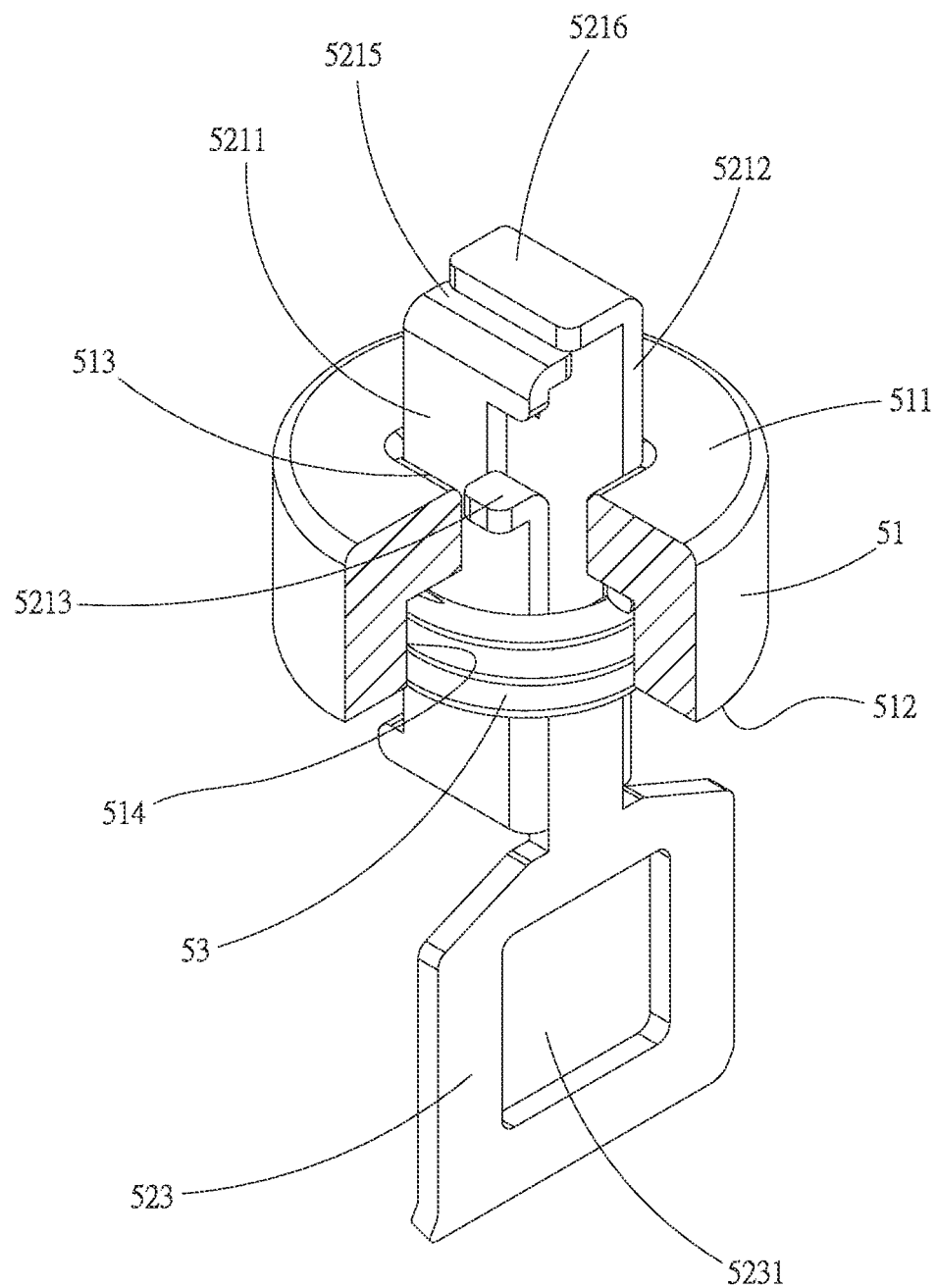
FIG. 4C is a cutaway view of the second heat sink fastening device of FIG. 4A.

Please refer to FIGS. 4A, 4B and 4C at the same time. The second heat sink fastening device 50 includes a ring member 51, a retaining member 52 and an elastic element 53. The ring member 51 has an upper portion 511 and a lower portion 512. The upper portion 511 internally defines an axial bore 513, and the lower portion 512 internally defines a receiving bore 514, which is communicable with the axial bore 513. The retaining member 52 includes an operating portion 521 and a retaining portion 523 downward extended from the operating portion 521. The retaining portion 523 has an engaging hole 5231 formed thereon. The operating portion 521 is axially received in the axial bore 513 and the receiving bore 514 of the ring member 51, and includes two facing first bent arm 5211 and second bent arm 5212. A space 5217 is formed between the first and the second bent arm 5211, 5212. The first bent arm 5211 has a first latch 5213 formed within a middle section thereof, and a first shoulder 5215 formed at an upper end thereof. Similarly, the second bent arm 5212 has a second latch 5214 formed within a middle section thereof, and a second shoulder 5216 formed at an upper end thereof. The first latch 5213 and the second latch 5214 are designed for pressing against a top of the upper portion 511 of the ring member 51. The first bent arm 5211 has a height smaller than that of the second bent arm 5212 and has the upper end bent toward the second bent arm 5212 to form the first shoulder 5215. Similarly, the upper end of the second bent arm 5212 is bent toward the first bent arm 5211 to form the second shoulder 5216, such that the first shoulder 5215 is located below the second shoulder 5216 with a height difference B defined between the two shoulders 5215, 5216. The elastic element 53 is a compression spring, which is received in the receiving bore 514 and fitted around the operating portion 521 of the retaining member 52.

Please refer to FIGS. 1 and 2 again. To assemble the first heat sink fastening device 30 to one lateral side of the heat sink 20, first place the operating member 31 on one of the two flat extended portions 211 of the base 21, such that the lower end 3112 of the cam portion 311 is aligned with the recess 212 on the flat extended portion 211 and the elastic element 34 is located between the cam portion 311 and the recess 212. Then, upward extend the upper end 311 of the retaining member 31 from a lower side of the flat extended portion 211 through the through hole 213 in the recess 212 and the axial bore 321 of the mounting ring to a height corresponding to the upper end 3111 of the cam portion 311. Finally, extend the pivot shaft 35 through the pivot holes 336 at the upper end of the retaining member 31, so that the pivot shaft 35 is rotatably connected to the retaining member 31.

To assemble the second heat sink fastening device 50 to the other lateral side of the heat sink 20, first place the ring member 51 on the other flat extended portion 211 of the base 21, such that the lower portion 512 of the ring member 51 is aligned with the recess 212 on the flat extended portion 211 and the elastic element 53 is located between the receiving bore 514 of the ring member 51 and the recess 212 of the flat extended portion 211. Then, upward extend an upper end of the retaining member 52 from a lower side of the flat extended portion 211 through the through hole 213 in the recess 212 as well as the receiving bore 514 and the axial bore 513 of the ring member 51 to a height above the upper portion 511 of the ring member 51. In this position, the elastic element 53 is fitted around the operating portion 521.

Figure 5A:
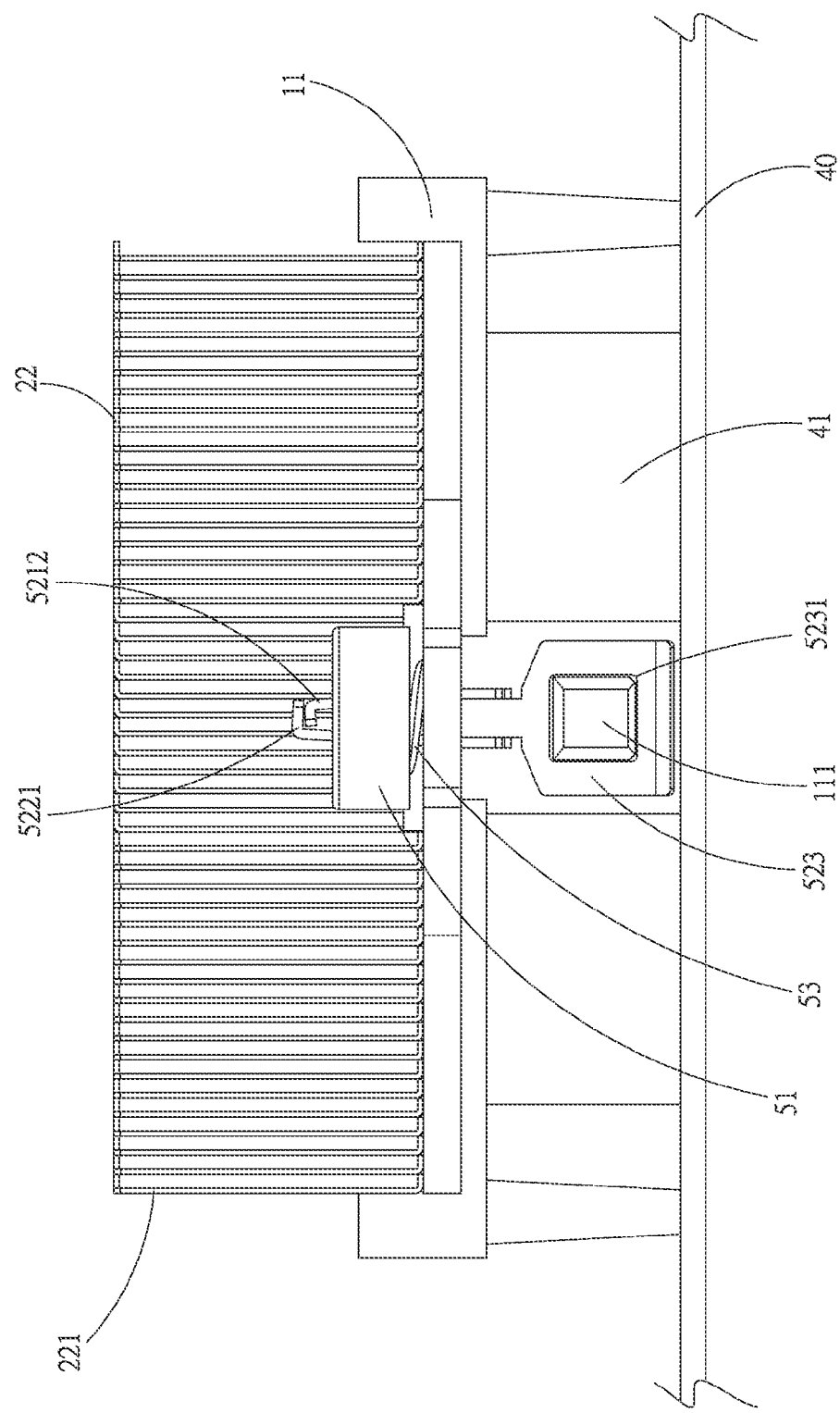
FIG. 5A is an elevational view showing the second heat sink fastening device of the present invention in a released state.
Figure 5B:
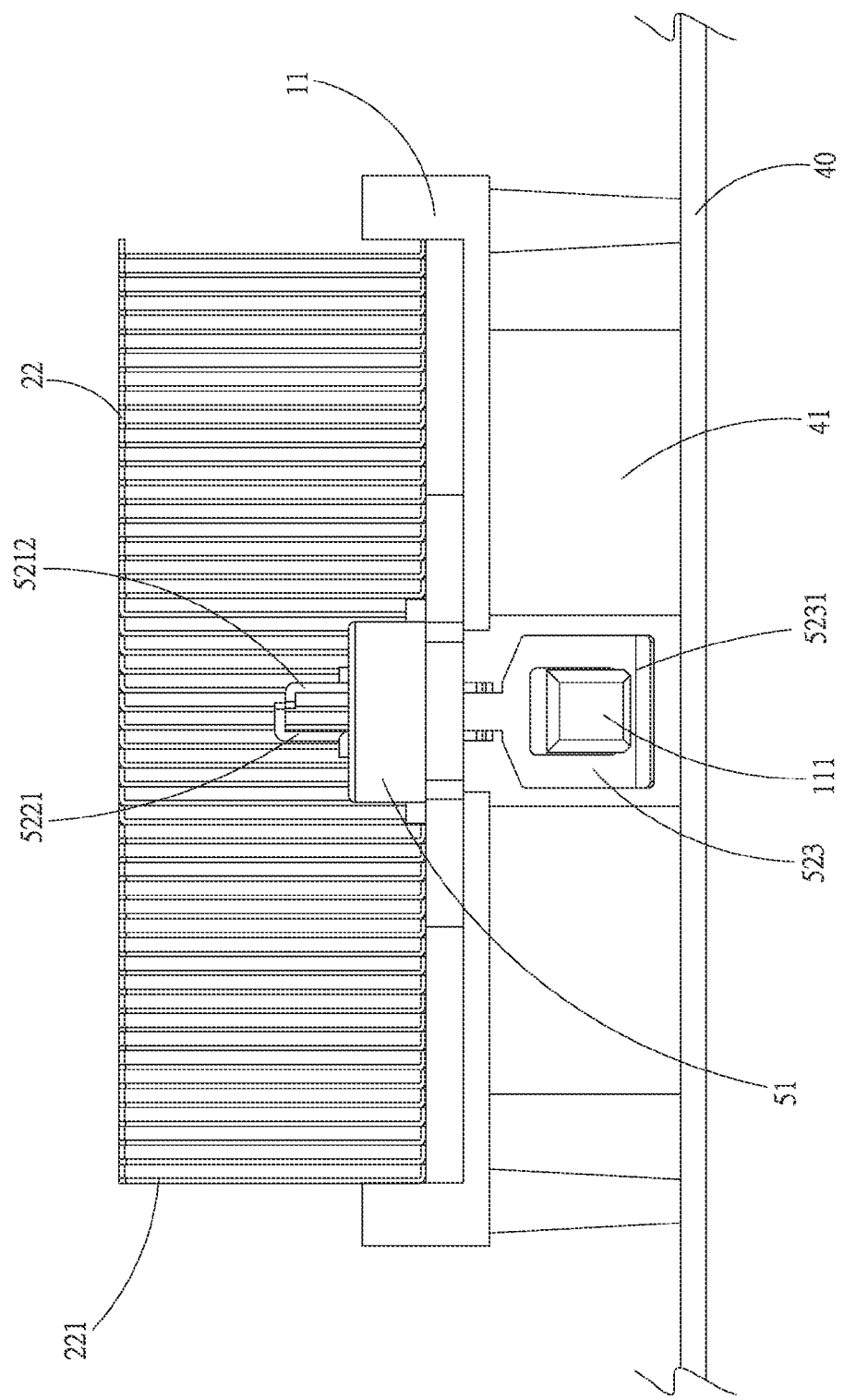
FIG. 5B is an elevational view showing the second heat sink fastening device of the present invention in a fastened state.

FIGS. 5A and 5B shows the second heat sink fastening device 50 is released from and fastened to the protrusion 111 on the mount body 11 of the mount 10, respectively. Please refer to FIGS. 5A and 5B. To fasten the heat sink 20 to the mount 10, first place the heat sink 20 on the mount 10 with the engaging hole 5231 on the retaining portion 523 of the second heat sink fastening device 50 loosely located around the protrusion 111 formed on the outer side of the mount body 11, as shown in FIG. 5A. Thereafter, as shown in FIG. 5B, downward push the ring member 51 at the upper portion 511 thereof for the first latch 5213 and the second latch 5214 to press against the top of the upper portion 511. Meanwhile, upward pull the retaining member 52 for the engaging hole 5231 to tightly abut on the protrusion 111. At this point, the elastic element 53 is in a compressed state and the second heat sink fastening device 50 is fastened to the protrusion 111.

To release the second heat sink fastening device 50 from the protrusion 111, first apply two opposing forces on two opposite outer sides of the first and second bent arms 5211, 5212, so that the two bent arms 5211, 5212 are moved toward each other into the space 5217 and the first latch 5213 and the second latch 5214 are caused to radially separate from the top of the upper portion 511 of the ring member 51, allowing a restoring force of the compressed elastic element 53 to apply on the ring member 51 and move the latter upwardly. At this point, the retaining member 52 can be moved downward to retract the first and second latches 5213, 5214 into the axial bore 513 and loose the engaging hole 5231 of the retaining portion 523 from the protrusion 111.

Figure 6A:
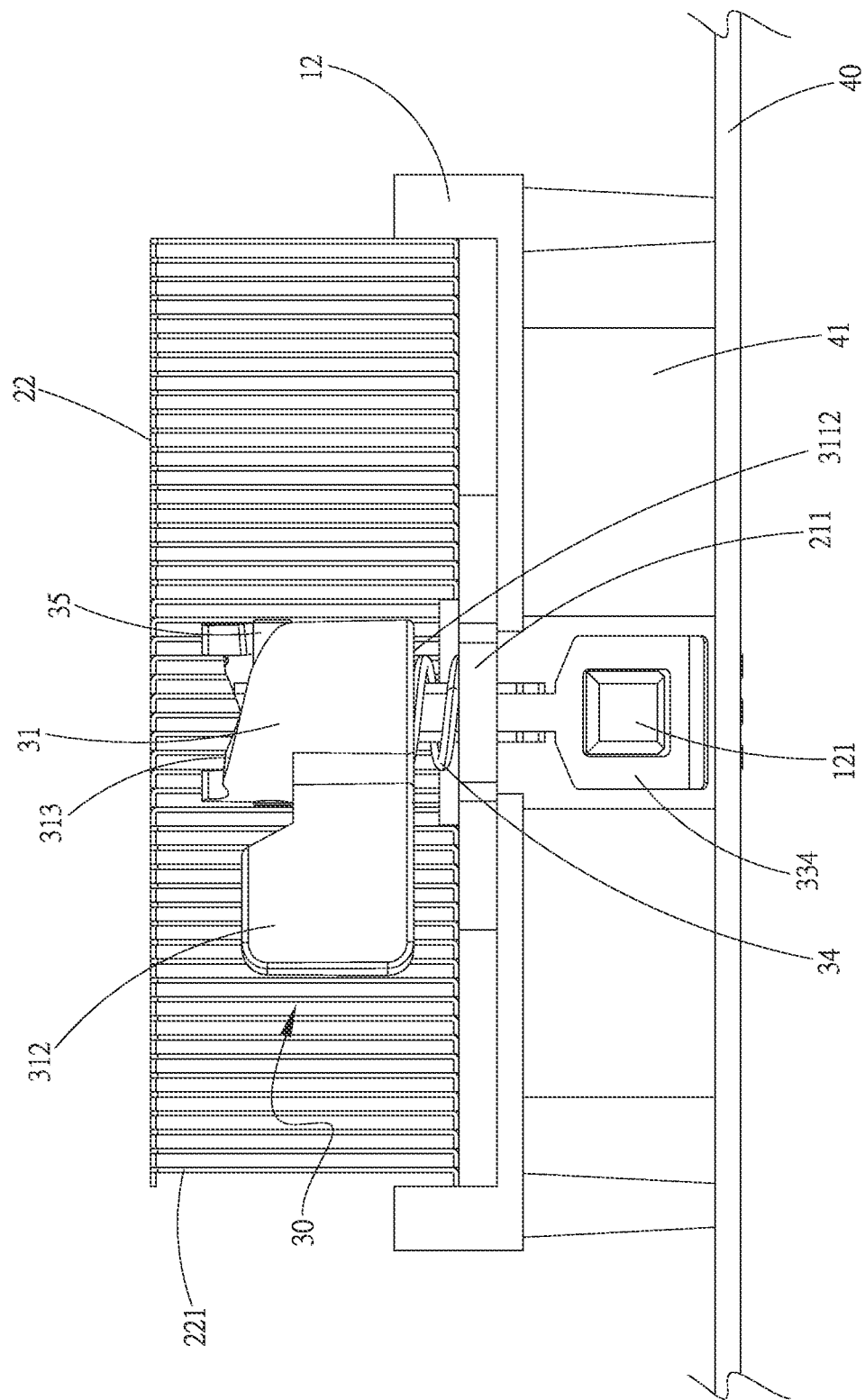
FIG. 6A is an elevational view showing the first heat sink fastening device of the present invention in a released state.
Figure 6B:
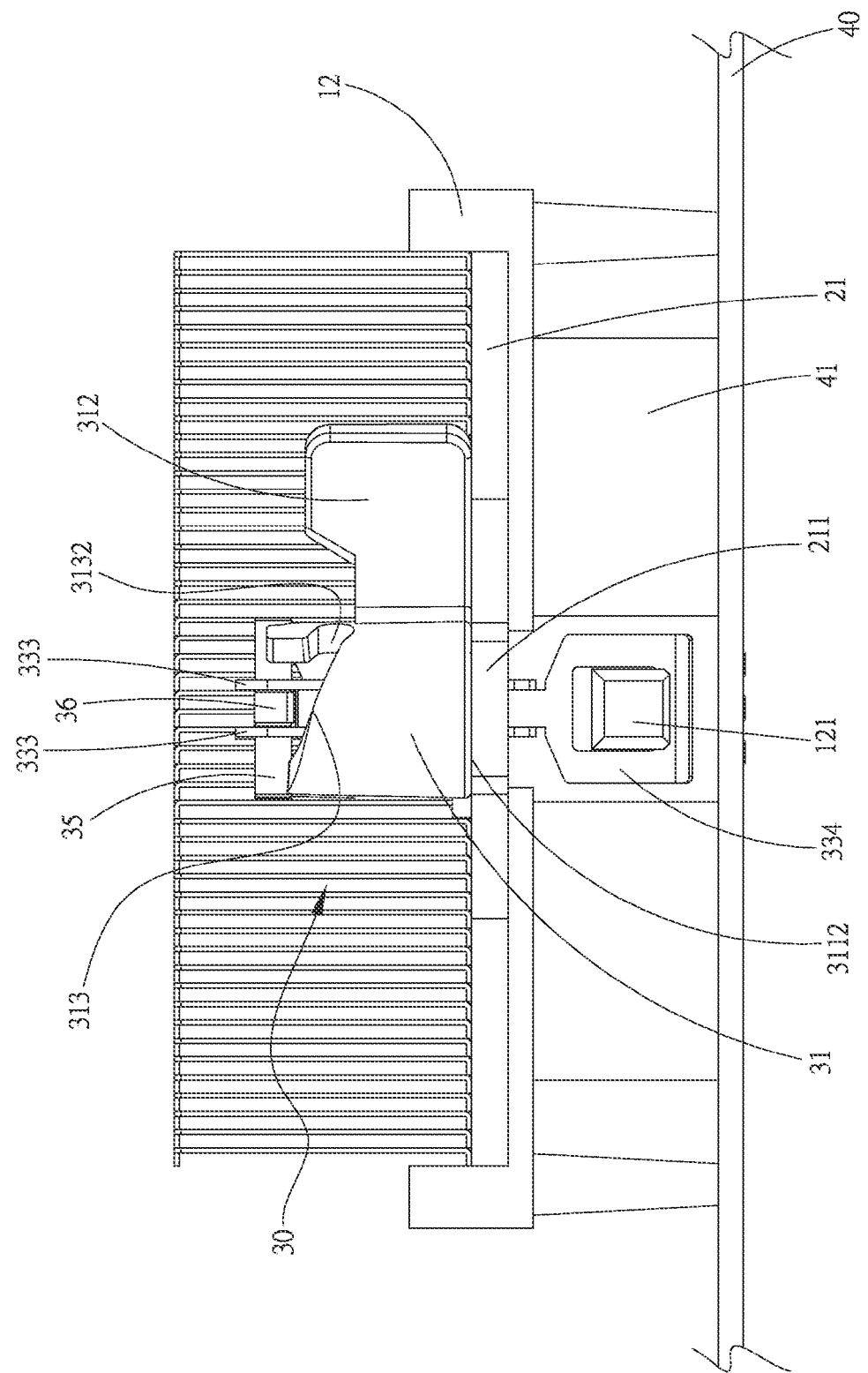
FIG. 6B is an elevational view showing the first heat sink fastening device of the present invention in a fastened state.

FIGS. 6A and 6B shows the first heat sink fastening device 30 is released from and fastened to the protrusion 121 on the mount body 12 of the mount 10, respectively. Please refer to FIGS. 6A and 6B along with FIG. 3B. When the first heat sink fastening device 30 is in a released state as shown in FIG. 6A, the engaging hole 335 on the retaining member 33 is loosely located around the protrusion 121 formed on the outer side of the mount body 12, the pivot shaft 35 is rested on the cam surfaces 313 of the cam portion 311 with the first end portion 351 and the second end portion 352 of the pivot shaft 35 set in the low-point notches 3132 on the cam surfaces 313, and the elastic element 34 located below the mounting ring 32 is fitted between the mounting ring 32 and the recess 212 of the flat extended portion 211 without being compressed. At this point, the lower end 3112 of the cam portion 311 is located above and separated from the flat extended portion 211 by a distance, within which the retaining member 33 can be moved upward and downward. Further, the switch portion 312 is currently located to a left side of the cam portion 311 when viewing in front of the drawing. By horizontally pulling the switch portion 312 from the left side toward the right side, as shown in FIG. 6B, the cam portion 311 is caused to rotate about the axis A, bringing the cam surfaces 313 to rotate from the descending bearing surfaces 3135 to the ascending bearing surfaces 3134 relative to the retaining member 33. While the cam surfaces 313 are rotated from the descending bearing surfaces 3135 to the ascending bearing surfaces 3134, the first end portion 351 and the second end portion 352 of the pivot shaft 35 are brought to move out of the low-point notches 3132 and move along the descending bearing surfaces 3135 and the ascending bearing surfaces 3134 to finally move into the high-point notches 3131. The pivot shaft 35 moving in the above manner brings the retaining member 33 to move upward in the direction of the axis A, so that the engaging hole 335 on the retaining member 33 is brought to tightly abut on the protrusion 121. Meanwhile, the lower end 3112 of the cam portion 311 is now rested on the top of the flat extended portion 211 and the elastic element 34 is in compressed state, and the first heat sink fastening device 30 fastens the heat sink 20 to the mount 10

As shown in FIG. 6B, when the first heat sink fastening device 30 is in the fastened state, the switch portion 312 of the operating member is located to the right side of the cam portion when viewing in front of the drawing. To release the first heat sink fastening device 30 from the protrusion 121, first horizontally shift the switch portion 312 of the operating member 31 from the right side to the left side, as shown in FIG. 6A, so that the cam portion 311 is caused to rotate about the axis A, bringing the cam surfaces 313 to rotate from the ascending bearing surfaces 3134 to the descending bearing surfaces 3135 relative to the retaining member 33. While the cam surfaces 313 are rotated from the ascending bearing surfaces 3134 to the descending bearing surfaces 3135, the first end portion 351 and the second end portion 352 of the pivot shaft 35 are brought to move out of the high-point notches 3131 and move along the ascending bearing surfaces 3134 and the descending bearing surfaces 3135 to finally move into the low-point notches 3132. The pivot shaft 35 moving in the above manner brings the retaining member 33 to move downward in the direction of the axis A, so that the engaging hole 335 on the retaining member 33 no longer tightly abuts on the protrusion 121 but is loosely located around the latter. Meanwhile, the cam portion 311 is returned to the position with its lower end 3112 located above the top of the flat extended portion 211 by a distance, and the elastic element 34 fitted between the mounting ring 32 and the recess 212 of the flat extended portion 211 restores to a non-compressed state.

With the elastic element 34, the first heat sink fastening device 30 can provide an increased elastic fastening force to ensure tight contact between the heat sink 20 and the heat-producing electronic element 41. The first heat sink fastening device 30 with the elastic element 34 also provides improved impact resistance to ensure good contact between the heat sink 20 and the heat-producing electronic element 41 over a long period of use. Such good contact between the heat sink 20 and the electronic element 41 in turn ensures good heat transfer efficiency of the thermal module assembly of the present invention.

In the illustrated preferred embodiment of the present invention, two differently structured first and second heat sink fastening devices 30, 50 are provided on two opposite sides of the heat sink 20. However, it is understood two identical heat sink fastening devices, such as two first heat sink fastening devices 30 or two second heat sink fastening devices 50, can be provided to two opposite sides of the heat sink 20.

In conclusion, the first heat sink fastening device according to the present invention is characterized in that the switch portion can be easily pulled for the cam portion to horizontally rotate about its axis, bringing the first and second ends of the pivot shaft rested on the cam surfaces to move from the high-point notches to the low-point notches or vice versa and causing the retaining member to correspondingly move downward or upward in the direction of the axis A, so that the retaining portion of the retaining member can be loosened from or tightened against the protrusion on the mount body. The first heat sink fastening device of the present invention is very suitable for use in a limited space because it can be quickly assembled to or disassembled from the heat sink without the need of any hand tool and any fastening element, and can be easily operated for the heat sink to tightly attach onto or release from the heat-producing electronic element.

The present invention has been described with a preferred embodiment thereof and it is understood that many changes and modifications in the described embodiment can be carried out without departing from the scope and the spirit of the invention that is intended to be limited only by the appended claims.

What is claimed is:

1. A heat sink fastening device, comprising:
an operating member including a cylindrical cam portion and a switch portion radially outward extended from an outer surface of the cam portion; the cam portion having an upper end and a lower end; the upper end being formed into a pair of cam surfaces, each of the cam surfaces having two opposite ends respectively formed with a high-point notch and a low-point notch; and the cam surfaces being respectively extended from the low-point notch to the high-point notch in an upward slope;
a mounting ring being mounted in the cam portion and internally defining an axial bore;
a retaining member being axially extended through the cam portion and having an upper end and a lower end; the upper end being provided with at least one pivot hole, and the lower end being downward extended to form a retaining portion, which is provided with at least one engaging hole; and the upper end of the retaining member being upward extended through the axial bore of the mounting ring to the upper end of the cam portion;
an elastic element being received in the cam portion and located below the mounting ring to fit on around the lower end of the retaining member; and
a pivot shaft being located on the upper end of the cam portion and rotatably received in the at least one pivot hole formed at the upper end of the retaining member; and the pivot shaft having a first end portion and a second end portion being separately rested on the pair of cam surfaces; and
wherein the switch portion of the operating member can be horizontally pulled from one position to another position to rotate the cam portion about an axis thereof, so that the cam surfaces are brought to rotate at the same time, causing the first end portion and the second end portion of the pivot shaft to move along the cam surfaces from the high-point notches to the low-point notches or vice versa, which in turn brings the retaining member to move downward or upward in the direction of the axis of the cam portion.

2. The heat sink fastening device as claimed in claim 1, wherein the cam portion internally defines an upper receiving space for receiving the mounting ring therein, and a lower receiving space located below the upper receiving space for receiving the elastic element therein; the upper receiving space being communicable with the lower receiving space; and a radially inward protruded annular rib portion being formed in the cam portion to locate between the upper and the lower receiving space.

3. The heat sink fastening device as claimed in claim 1, wherein the pivot shaft includes a middle section, which is located between the first end portion and the second end portion and has a stop ring fitted therearound.

4. The heat sink fastening device as claimed in claim 1, wherein the cam surfaces respectively have a length being an ascending bearing surface located adjacent to the high-point notch and another length being a descending bearing surface located adjacent to the low-point notch.

5. The heat sink fastening device as claimed in claim 1, wherein the retaining member includes two facing arm portions extended from the lower end to the upper end of the retaining member, and the pivot hole being formed on each of the arm portions at the upper end.

6. A thermal module assembly, comprising:
a mount being provided on two opposite outer sides with a protrusion each;
a heat sink being mounted on the mount and including a base associated with the mount and a radiation fin assembly held on the base; the base being provided on two opposite lateral sides with two outward extended flat portions, each of the flat extended portions being provided on a top with a recess, and the recess having a through hole formed on a bottom thereof to extend through the flat extended portion;
a heat sink fastening device being located on at least one side of the heat sink and including:
an operating member being located above one of the flat extended portions and including a cylindrical cam portion and a switch portion radially outward extended from an outer surface of the cam portion; the cam portion having an upper end and a lower end; the upper end being formed into a pair of cam surfaces, each of the cam surfaces having two opposite ends respectively formed with a high-point notch and a low-point notch; the cam surfaces being respectively extended from the low-point notch to the high-point notch in an upward slope; and the lower end of the cam portion being aligned with the recess on the flat extended portion;

a mounting ring being mounted in the cam portion and internally defining an axial bore;

a retaining member being axially extended through the cam portion and having an upper end and a lower end; the upper end being provided with at least one pivot hole, and the lower end being downward extended to form a retaining portion, which is provided with at least one engaging hole for engaging with one of the protrusions formed on the mount; and the upper end of the retaining member being upward extended through the through hole on the flat extended portion and the axial bore of the mounting ring to the upper end of the cam portion;

an elastic element being received in the cam portion and located between the mounting ring and the recess of the flat extended portion to fit on around the lower end of the retaining member; and a pivot shaft being located on the upper end of the cam portion and rotatably received in the at least one pivot hole formed at the upper end of the retaining member; and the pivot shaft having a first end portion and a second end portion being separately rested on the pair of cam surfaces; and wherein the switch portion of the operating member can be horizontally pulled from one position to another position to rotate the cam portion about an axis thereof, so that the cam surfaces are brought to rotate at the same time, causing the first end portion and the second end portion of the pivot shaft to move along the cam surfaces from the high-point notches to the low-point notches or vice versa, which in turn brings the retaining member to move downward or upward in the direction of the axis of the cam portion.

7. The thermal module assembly as claimed in claim 6, wherein the mount is connected to a circuit board, on which at least one heat-producing electronic element is mounted; the mount including two mount bodies that are symmetrically located at two opposite lateral sides of the electronic element, and the protrusions being provided on two opposite outer sides of the two mount bodies.

8. The thermal module assembly as claimed in claim 6, wherein the radiation fin assembly has two retreated portions formed on two opposite lateral sides thereof, and the base having two stoppers provided on a top surface at positions corresponding to the two retreated portions on the radiation fin assembly.

9. The thermal module assembly as claimed in claim 6, wherein the cam portion internally defines an upper receiving space for receiving the mounting ring therein, and a lower receiving space located below the upper receiving space for receiving the elastic element therein; the upper receiving space being communicable with the lower receiving space; and a radially inward protruded annular rib portion being formed in the cam portion to locate between the upper and the lower receiving space.

10. The thermal module assembly as claimed in claim 6, wherein the pivot shaft includes a middle section, which is located between the first end portion and the second end portion and has a stop ring fitted therearound.

11. The thermal module assembly as claimed in claim 6, wherein the cam surfaces respectively have a length being an ascending bearing surface located adjacent to the high-point notch and another length being a descending bearing surface located adjacent to the low-point notch.

12. The thermal module assembly as claimed in claim 6, wherein the retaining member includes two facing arm portions extended from the lower end to the upper end of the retaining member, and the pivot hole being formed on each of the arm portions at the upper end.

\* \* \* \* \*